United States Patent
Sherman et al.

(10) Patent No.: US 11,705,258 B2
(45) Date of Patent: Jul. 18, 2023

(54) HIGH FREQUENCY LOW LOSS MAGNETIC CORE AND METHOD OF MANUFACTURE

(71) Applicant: Powdermet Inc., Euclid, OH (US)

(72) Inventors: Andrew Sherman, Mentor, OH (US); Haixong Tang, Euclid, OH (US)

(73) Assignee: POWDERMET, INC.

( * ) Notice: Subject to any disclaimer, the term of this patent is extended or adjusted under 35 U.S.C. 154(b) by 762 days.

(21) Appl. No.: 16/596,949

(22) Filed: Oct. 9, 2019

(65) Prior Publication Data

US 2020/0118723 A1 Apr. 16, 2020

Related U.S. Application Data

(60) Provisional application No. 62/743,616, filed on Oct. 10, 2018.

(51) Int. Cl.
| | |
|---|---|
| H01F 1/24 | (2006.01) |
| H01F 1/33 | (2006.01) |
| H01F 27/255 | (2006.01) |
| B22F 1/02 | (2006.01) |
| B22F 1/00 | (2022.01) |
| B22F 1/16 | (2022.01) |
| B22F 1/142 | (2022.01) |
| B22F 1/05 | (2022.01) |
| B22F 1/102 | (2022.01) |
| B22F 1/08 | (2022.01) |

(52) U.S. Cl.
CPC ............ *H01F 1/24* (2013.01); *B22F 1/05* (2022.01); *B22F 1/102* (2022.01); *B22F 1/142* (2022.01); *B22F 1/16* (2022.01); *H01F 1/33* (2013.01); *H01F 27/255* (2013.01); *B22F 1/08* (2022.01); *B22F 2302/45* (2013.01); *B22F 2304/10* (2013.01)

(58) Field of Classification Search
None
See application file for complete search history.

(56) References Cited

U.S. PATENT DOCUMENTS

| | | | |
|---|---|---|---|
| 7,544,417 B2 * | 6/2009 | Maeda | B22F 1/16 428/407 |
| 8,986,839 B2 * | 3/2015 | Yonetsu | B22F 1/054 428/407 |
| 2003/0077448 A1 * | 4/2003 | Ueta | H01F 1/26 428/404 |
| 2004/0183643 A1 | 9/2004 | Brunner | |
| 2012/0019341 A1 | 1/2012 | Gabay et al. | |
| 2014/0132376 A1 | 5/2014 | Jin | |

(Continued)

FOREIGN PATENT DOCUMENTS

| | | | | |
|---|---|---|---|---|
| EP | E P-869517 A1 * | 10/1998 | | H01F 1/24 |
| JP | 2006049729 A * | 2/2006 | | |
| JP | 2015076579 A * | 4/2015 | | |

OTHER PUBLICATIONS

Machine translation JP-2015076579-A (Year: 2015).*

(Continued)

*Primary Examiner* — Alexandre F Ferre
(74) *Attorney, Agent, or Firm* — Ulmer & Berne LLP; Brian E Turung

(57) ABSTRACT

A high saturation, low loss magnetic material suitable for high frequency electrical devices, including power converters, transformers, solenoids, motors, and other such devices.

19 Claims, 5 Drawing Sheets

(56) References Cited

U.S. PATENT DOCUMENTS

2014/0291296 A1   10/2014   Jin et al.
2016/0159653 A1    6/2016   Carpenter et al.
2019/0283127 A1    9/2019   Kinouchi et al.
2019/0304647 A1   10/2019   Cui et al.

OTHER PUBLICATIONS

Machine translation JP-2006049729-A (Year: 2006).*
US Search Authority, "International Search Report and Written Opinion" for corresponding application No. PCT/US2015/055309 (dated Jan. 10, 2020).

* cited by examiner

HIGH FREQUENCY LOW LOSS MAGNETIC CORE AND METHOD OF MANUFACTURE

The present disclosure claims priority on U.S. Provisional Application Ser. No. 62/743,616 filed Oct. 10, 2018, which is incorporated herein.

FIELD OF DISCLOSURE

The disclosure is directed to the design of high saturation, low loss magnetic materials, and particularly to high saturation, low loss magnetic materials suitable for use in high frequency electrical devices including, but not limited to, power converters, transformers, solenoids, motors, and other such devices. The disclosure is also directed to high saturation, low loss magnetic materials formed of insulator-coated nanostructured dust core magnet particles with high saturation, high permeability, low eddy current losses. The disclosure is also related to methods for consolidating these high saturation, low loss magnetic materials for use in high frequency power conversion applications.

BACKGROUND OF THE DISCLOSURE

With the increasing demand for greater and more efficient performance of motors, generators and transformers, such demand has spurred a search for new materials with which compact magnetic cores having greatest saturation induction and little or no hysteresis loss can be constructed.

The most important characteristic of soft magnetic core components are their maximum induction, magnetic permeability, and core loss characteristics. When a magnetic material is exposed to a rapidly varying magnetic field, a resultant energy loss in the core material occurs. These core losses are commonly divided into two principle contributing phenomena: hysteresis and eddy current losses. Hysteresis loss results from the expenditure of energy to overcome the retained magnetic forces within the core component. Eddy current losses are brought about by the production of induced currents in the core component due to the changing flux caused by alternating current (AC) conditions.

The use of powdered magnetic materials allows for the manufacture of magnetic parts that have a wide variety of shapes and sizes. Conventionally, however, these materials are made from consolidated powdered magnetic materials that have been limited to being used in applications involving direct currents. Direct current applications, unlike alternating current applications, do not require the magnetic particles to be insulated from one another in order to reduce eddy currents.

Electrical devices such as a solenoid valve and a motor are usually operated at a frequency of several hundred hertz or lower. An electrical steel sheet, which is advantageous in that it provides a low core loss, has been used for the material of an iron core of such electrical devices. The core loss of magnetic core materials is broadly divided into hysteresis loss and eddy current loss. Many such devices are fabricated from electrical sheet steel, made of an iron-silicon alloy having a relatively low coercive force. An insulation treatment is typically performed on the surface of the sheets; the sheets are then laminated. Such an electrical steel sheet is known as a material particularly having a low hysteresis loss. The eddy current loss is proportional to the second power of the operating frequency, whereas the hysteresis loss is proportional to the operating frequency.

Therefore, when the operating frequency is a band of several hundred hertz or lower, the hysteresis loss is dominant. The use of an electrical steel sheet, which has a low hysteresis loss, is effective in this frequency band. However, since the eddy current loss is dominant in an operating frequency band of several kilohertz, an alternative material of an iron core replacing the electrical steel sheet is necessary. In such a case, a dust core and a soft ferrite magnetic core, which exhibits relatively satisfactory low eddy current loss characteristics, are typically used. Dust cores are produced using a powdery soft magnetic material such as iron, iron-silicon alloy, Sendust™ alloy, permalloy, or iron-based amorphous alloy.

More specifically, dust cores are produced as follows: a binder having an excellent insulating property is mixed with a soft magnetic material, or an insulation treatment is performed on the surface of the powder. The material is then molded under pressure. The formed soft ferrite magnetic core is known as a excellent low eddy current loss material because the material itself has a high electric resistance. However, since the use of a soft ferrite decreases the saturation flux density, it is difficult to achieve a high output. The dust core is advantageous from this standpoint because a soft magnetic material having a high saturation flux density is used as a main component.

In a production process of a dust core, pressure molding is performed, and deformation during the pressure molding causes distortion of the powder, which retains a residual stress. Consequently, coercive force is increased, resulting in an increase in the hysteresis loss of the dust core. Therefore, when the dust core is used as the material of an iron core, after a compact is prepared by pressure molding, a process of removing the distortion must be performed.

An effective process of removing such distortion is thermal annealing of the compact. When the temperature during this heat treatment is set to a high value, the effect of distortion removal is increased, thereby reducing the hysteresis loss. However, when the temperature during the heat treatment is set to an excessively high value, an insulating binder or an insulating coating constituting the soft magnetic material is decomposed or degraded, resulting in an increase in the eddy current loss. Therefore, the heat treatment is inevitably performed only at a temperature range that does not cause such a problem. Accordingly, improving the heat resistance of the insulating binder or the insulating coating constituting the soft magnetic material is important in order to decrease the core loss of the dust core.

Conventionally, magnetic particles are coated with thermoplastic materials to act as a barrier between the particles to reduce induced eddy current losses. However, in addition to the relatively high cost of such coatings, the plastic has poor mechanical strength and, as a result, parts made using plastic-coated particles have relatively low mechanical strength. Additionally, many of these plastic-coated powders require a high level of binder when pressed together. The addition of the binder results in decreased density of the pressed core part and, consequently, a decrease in magnetic permeability and lower induction. Additionally, such plastic coatings typically degrade at temperatures of 150-200° C. Accordingly, thermoplastic-coated magnetic particles are of limited utility.

Brunner (U.S. Pat. No. 7,532,099) describes coated alloy particles which are employed with a ferromagnetic alloy powder and a thermoplastic or duroplastic polymer to prepare an injection molded or cast soft magnetic core. An alloy of iron, copper, niobium, silicon, and boron is heat treated to form a nanocrystalline structure, then comminuted in a mill to obtain particles having dimensions of about 0.01-1.0 mm.

An abrasion-resistant layer of iron and silicon oxide of 150-400 nm is coated on the particles.

Anand et al. (U.S. Pat. No. 6,808,807) describes encapsulated ferromagnetic powders obtained by coating a ferromagnetic core with a polyorganosiloxane or polyorganosilane and thermally treating the coated core to convert the polymer to a residue containing silicon and oxygen. The core alloy may be iron alloyed with silicon, aluminum, nickel, cobalt, boron, phosphorous, zirconium, neodymium, and/or carbon. Ferromagnetic core particles having an average diameter of less than 2 mm are suitable for this composition.

Gay et al. (U.S. Pat. No. 6,193,903) describes ceramic-coated ferromagnetic powders. The powders are iron or an iron alloy and the encapsulating layer on the particle may be one of a group of ceramics such as a metal oxide, metal nitride, metal silicate, and a metal phosphate. The particle size is 5-1000 µm. Silica is listed as one of a large group of ceramic materials suitable as the coating.

Moorhead et al. (U.S. Pat. No. 6,051,324) describes particles of an alloy of iron/cobalt/vanadium having a particle size of less than 44 µm which are coated with a glass, ceramic, or ceramic glass, including silicon dioxide.

Atarashi et al. (U.S. Pat. No. 5,763,085) describes a magnetic particle having multiple layers on its surface which is useful as a starting material for color magnetic materials such as magnetic toners. The particles are of a size of 0.01-200 µm. Silicon dioxide is described as a metal oxide coating along with preparation by a sol gel method. The preparation of a metal layer on the particle by reduction of a soluble metal salt in the presence of a complexing agent is provided.

Yamanaka et al. (U.S. Pat. No. 4,983,231) describes a surface-treated magnetic powder obtained by treating an iron-rare earth metal alloy with alkali-modified silica particles. The mean particle diameter of the alloy particles is 20-200 µm. The alkali silicate dehydrates are heated and then condensed to form a "polysiloxane" coating.

Uozumi et al. (JP 2007-123703) describes the application of a silicate coating to soft magnetic powders including alloys of iron, cobalt, and vanadium having a mean particle size of 70 µm. The coated particles are heat treated to cause migration of silicon and oxygen into the soft magnetic core to form a diffusion zone between the outer oxide layer and the soft magnetic core.

Yamada et al. (JP 03-153838) describes the surface treatment of an iron/cobalt/vanadium powder with a compound containing silicon and an alkoxy group (such as vinyl triethoxysilane).

Additional prior art references for producing magnetic powders are as follows: U.S. Pat. No. 5,348,800 to Moro et al. (Composite Soft Magnetic Core); U.S. Pat. No. 5,352,522 to Kugimiya et al. (Composite Material With Dielectric); U.S. Pat. No. 6,051,324 to Moorhead et al. (Composite of Ceramic-Coated Magnetic); U.S. Pat. No. 7,179,337 to Suzuki et al. (Method or Producing Soft Magnet); U.S. Pat. No. 7,485,366 to Ma et al. (Thick Film Magnet); U.S. Pat. No. 7,544,417 to Maeda et al. (Soft Magnet Material and Dust Core); U.S. Pat. No. 7,682,695 to Kugai et al. (Dust Core with Specific Ratio); U.S. Pat. No. 7,763,094 to Suetsuna et al. (Method of High Frequency Magnet Core); U.S. Pat. No. 8,986,839 to Yonetsu et al. (Metal Containing Particle Aggregate); U.S. Pat. No. 9,431,159 to Rowe et al. (Iron Cobalt Ternary Alloy With Silica); U.S. Pat. No. 10,062,482 to Zhou et al. (Rapid Consolidation Method); US 2006/0124464 to Lemieux (High Performance Magnet/Method); US 2008/0044679 to Maeda et al. (Soft Magnetic Material Powder . . . US 2008/0231409 to Kugai et al. (Dust Core and Method); and US 2013/0292081 to Hosek et al. (System and Method for Insulating).

Current and future power and electronic systems such as motor drives, inverters, converters, and pulse-forming networks (among others) are currently limited by size, cost, and power largely due to size and magnetic/inductor components losses. Due to their increased losses at higher frequencies and fluxes, current magnetic cores (typically based on ferrites such as the Phillips 3F3 Ferroxycube™ materials for higher frequencies) have limited switching frequencies. The low saturation values of ferrites also limits the device power. Wide band gap semiconductor switching devices dramatically decrease switching losses and can be scaled to high power. With the increased development of distributed power, high efficiency power conversion is increasingly important in total energy use. By increasing the operating frequency and enabling the use of higher field levels, higher flux densities (rate of change of magnetic field) in wide band gap semiconductor power converters enable the converter size to be substantially reduced from current surface-mount designs, thereby reducing the size, cost, and weight of such devices. Developing improved low loss, high permeability magnetic materials therefore results in a significant increase in reliability and performance for the distributed power systems and switching power supplies that predominate today's grid, communications, and control environment.

By increasing the frequency of these devices from 10-20 KHz to 0.2-5 MHz for switching power supplies, the inductor/transformer size can be reduced by approximately one order of magnitude, while simultaneously reducing capacitor and other charge storage device size in the system. Magnetic (induction) and charge (capacitance) storage requirements are related to frequency, such that a tenfold reduction in storage time (i.e., increased frequency) results in a similar reduction in storage (size) required for the same power loading. A tenfold increase in switching frequency will therefore enable a tenfold increase in power density (at constant size) or, alternatively, a tenfold reduction in capacitor and magnetic (inductor) size. Both cost and size benefits will accrue from such a reduction, along with secondary enhancements such as making higher power DC-DC converters compatible with current surface mounting equipment (presently limited to roughly 20 grams), thereby enabling further reduction in cost and size.

Currently, solar power generation costs have reached cost parity with fossil fuels. The solar power generated at a few volts, as well as the battery storage power, must be upconverted to grid voltages requiring conversion devices. Increasing the efficiency of these devices using wide band gap semiconductor switching devices is essential to grid efficiency and for adapting the grid to distributed power generation. For 100 kW systems, where power converters account for 20% of the system cost and power losses, improved magnetic and switch mode converters can yield a significant reduction in power delivery system packaging. The technology advance associated with the particles of the present disclosure is one of the keys to solving the challenge of distributed power and grid stability in the coming decades.

Soft metallic materials have the highest permeability and very high saturation flux limits. These materials can be developed from iron, iron-silicon, iron-nickel and iron-cobalt alloys. Such alloys include 1) Permalloy, Molypermalloy, Hipernic/Deltamax, and Supermalloy; 2) iron-cobalt alloys including Hiperco, Permendur and Supermendur; 4) iron-aluminum-silicon alloys including Sendust and Alfenol; and 4) other materials including 1040 and Perminvar.

Metallic soft magnetic materials are commonly used in transformers and inductors (load coils, motors) and are characterized by very high permeability and high magnetic saturation values, leading to higher energy storage capabilities. Unfortunately, their high conductivities cause large eddy current losses when used at high frequencies unless manufactured in very thin sheets or foils. The key to creating high frequency devices using metallic materials is to produce very thin foils from these materials. Application in the 1 MHz range requires foil thicknesses in the micron range to reduce eddy current losses to acceptable levels. Magnetic tapes in the micron size range have been used in recording applications and transformers at moderate frequencies up to 1 MHz at thicknesses of 3-4 μm.

FIG. 1 illustrates typical DC magnetization curves for common magnetic materials.

In current technologies, ferrites are used for high frequency applications. In these applications, ferrites offer several advantages over metallic magnetic materials, including resistivity in the insulating range, attractive magnetic properties at high frequencies, and high corrosion resistance. Because their resistivity are at least one million times greater than metallic materials, solid ferrites can be used in place of laminated cores for inductors and transformers. Unfortunately, ferrites have the disadvantages of low magnetic saturation, relatively low Curie temperatures, and poor mechanical properties. In addition, conventional manufacturing techniques and the poor machinability of ferrites limit the ability to produce ferrite materials that have close dimensional tolerances.

Development and subsequent commercial production of amorphous alloys during the 1970s and 1980s began the reduction of losses with higher operation frequencies at the expense of magnetization. Further advances were demonstrated in the late 1980s and early 1990s using new alloy compositions and controlled crystallization of amorphous alloy precursors to produce nanocrystalline grains. These nanocrystalline soft magnetic materials provided an important complement of the high magnetization of conventional soft magnetic alloys (i.e., silicon-steels) and the high resistivity of amorphous alloys (i.e., Metglas®). The discovery of the first of the soft nanocrystalline magnetic materials (Finemet®) in 1988 provided a surprisingly small coercivity. Magnetic domain walls, which move through a magnetic material as its magnetization is swept from one direction to another, are generally "pinned" on grain boundaries. Therefore, conventional alloy designs required the increase of grain size to reduce the coercivity by reducing the amount of grain boundary in the material. The fact that an extremely fine-grained structure leads to good magnetic properties comes as a surprise since; conventional soft magnetic alloys, the coercivity Hc increases with decreasing grain size D, yet excellent soft magnetic properties are re-established in the grain size regime below about 20 nm. This seemingly anomalous behavior was explained by a random anisotropy model, originally developed for amorphous alloys. The new application of this model to nanocrystalline alloys showed that, as the grain diameter was reduced below the exchange correlation length, the magnetocrystalline anisotropy is averaged over the exchange correlation length, leaving a significantly reduced magnetocrystalline anisotropy.

FIG. 2 illustrates coercivities as a function of grain size for conventional and nanocrystalline soft magnetic alloys. Coercivity is important since it leads to power losses in the form of heat. For high power or very small transformers, heat generation through eddy current losses and hysteresis losses have a significant impact on the size, weight, temperature limits, cooling requirements, and overall performance of a magnetic component.

Nanocrystalline alloys that are formed of a base metal of iron, silicon, and/or boron with additions of niobium and copper can be produced via rapid solidification technology as a thin ribbon, initially in the amorphous state, and then crystallized in a subsequent heat treatment around 500-600° C. This process gives rise to an extremely fine-grained microstructure with grain sizes of 10 nm—hence the name nanocrystalline. These nanocrystalline alloys combine low magnetic anisotropy and low magnetostriction, both prerequisites for high magnetic permeability, with high magnetic flux density, Bs, and good thermal stability. One of the major issues limiting the use of amorphous and nanocrystalline alloys is their extreme brittleness after annealing. This prevents their use in structural applications such as magnetic bearings and high speed rotors except as thin foils. It also limits the tolerances and geometries achievable in cores.

Magnetic losses arise from two primary sources: hysteresis losses and eddy current losses. Hysteresis loss arises from the work in moving magnetic domain boundaries through a material, and is minimized in single crystal (easy axis aligned with the field), zero magnetostatic materials and/or amorphous materials lacking grain boundaries/pinning sites for domain motion. Most high permeability alloys have been designed around zero magnetostriction compositions in which domain wall motion is not impeded by stress/strain effects. By eliminating magnetostrictive effects (through composition selection and use of nanocrystalline alloys) and grain boundary pinning (amorphous materials), huge permeability and low hysteresis loss materials have been developed for use in transformer cores.

Eddy current losses (the most important for high frequency applications) arise due to current flow in AC systems in response to the magnetic flux. Eddy current losses arise due to the overall field (classical eddy current loss), as well as to fields set up by domain wall motion (anomalous eddy current losses). Eddy current losses are reduced by increasing a material's resistivity (i.e., by addition of silicon to iron, amorphous materials, ferrites), and by eliminating domain boundaries (i.e., single domain particles, superparamagnetic materials, quasi-crystalline materials).

A significant number of efforts have investigated the use of metal doping in combination with the exposure to oxygen or a plasma environment to create in situ oxide (insulator) coatings during the processing of magnetic cores to reduce eddy current losses. While improvements have been made for such techniques, prior efforts have fallen short on producing low hysteresis and eddy current losses while maintaining high magnetic saturation. As such, there still exists a need for higher magnetic saturation, higher frequency capable magnetic cores to reduce the size, cost, and losses associated with power transformers, converters, and controllers.

SUMMARY OF THE DISCLOSURE

The present disclosure is directed to the design of high saturation (e.g., >1.5 T), low loss magnetic materials (e.g., power density<2000 kW/m$^3$) and methods for making the same, wherein such materials are suitable for use in high frequency electrical devices such as, but not limited to, power converters, transformers, solenoids, motors, and other such devices. The high saturation, low loss magnetic material can optionally be in the form of an insulator-coated nanostructured dust core magnet particles with high saturation (e.g., >1.5 T), high permeability (>1000), and low eddy current losses (e.g., power density<2000 kW/m$^3$). The materials can be consolidated for use in high frequency power conversion applications (e.g., >20 kHz).

In one non-limiting aspect of the present disclosure, a hierarchically-structured magnetic powder is consolidated using a rapid consolidation technique, such as field assisted or spark plasma sintering, to form a magnetic material or core. The high rate sintering (>100° C./min) can be used to limit diffusional processes, limit atomic rearrangement, and maintain the engineered structure created in the insulator-coated magnetic particles.

In another non-limiting aspect of the present disclosure, there is provided particles that can replicate the frequency capabilities of ferrites to create significant improvements in power conversion efficiency. In one non-limiting embodiment, the particles are formed from iron-cobalt alloys through micro/nanostructural engineering.

In another non-limiting aspect of the present disclosure, the particles in accordance with the present disclosure enable the production of magnetic materials capable of operating at a frequency greater than 200 kHz at an ambient operating temperature of up to 200° C. or more, with an allowable temperature rise of 50-100° C. (and all values and ranges therebetween). In one non-limiting embodiment, the resultant magnetic materials formed from the particles in accordance with the present disclosure can one or more of the following properties:

operating frequency of 200 kHz-5 MHz (and all values and ranges therebetween);
low eddy current losses (e.g., less than 15%, less than 10%, less than 5%, less than 1%) at 0.2-5 MHz (and all values and ranges therebetween);
200° C.+ operating temperatures (e.g., 250° C.+; 300° C.+, 350° C.+; 400° C.+; 450° C.+; 5000° C.+). The lower operation temperature can be significantly less than 0° C. (e.g., −100° C.; −50° C.; −25° C.);
>1.8 T saturation at 200° C. (e.g., 1.81-3+ (and all values and ranges therebetween)); and
100+ permeability (e.g., 101-200 (and all values and ranges therebetween)).

In another non-limiting aspect of the present disclosure, the magnetic alloys (e.g., iron-cobalt alloys, etc.) in accordance with the present disclosure are modified to increase their frequency capability in solid cores by creating a ferrite-like microstructure of insulating grain boundaries using particle nano-engineering technology.

In another non-limiting aspect of the present disclosure, a first technique used to create the desired magnetic materials in accordance with the present disclosure involves applying/mixing insulating dielectric coatings with high magnetic saturation metal powders (e.g., >1.5 T) using a) fluidized bed chemical vapor deposition, b) preceramic-polymer coating and pyrolysis, atomic, or molecular layer deposition, or c) sol-gel/solution techniques. The insulating dielectric coatings have a thickness of 0.1-1500 μm (and all values and ranges therebetween), and typically 2-50 μm. The one or more coatings are applied to the magnetic particles at thicknesses of 1 nm to 1 μm (and all values and ranges therebetween), and typically about 5-100 nm. The coating generally constitutes less than 10 vol. % of the total volume of the coated particle, and typically less than 5 vol. % of the total volume of the coated particle, and more typically less than 2.5 vol. % of the total volume of the coated particle. Generally, the coating constitutes at least 0.05 vol. % of the total volume of the coated particle. When the coating is less than 20 nm thick, exchange coupling and easier magnetization can be achieved between isolated domains. The metal powder generally is 1-200 μm (and all values and ranges therebetween), and typically 2-100 μm. The high magnetic saturation metal powder includes iron-cobalt alloys, iron, iron-silicon alloys, iron-nickel alloys, etc. The insulator-coated particles can be consolidated using spark plasma or other field-assisted sintering processing combining rapid heating and pressure to fabricate fully dense cores having high saturation (e.g., >1.5 T), low coercivity (e.g., <10 Oersted), and low eddy current losses (e.g., power density<2000 kW/m$^3$) at 0.2-5 MHz.

In another non-limiting aspect of the present disclosure, a second technique used to create the desired magnetic materials in accordance with the present disclosure involves forming the high saturation magnetic cores from magnetic powders (e.g., iron-cobalt alloy powders, etc.) using rapid solidification or mechanical alloying techniques to refine their grain structure to 5-50 nm in size so as to reduce coercivity. The metal powder generally is 1-200 μm (and all values and ranges therebetween), and typically 2-100 μm. The metal powder can be bonded together by any number of techniques (e.g., melt atomization, rapid solidification (such as melt-spinning), blended elemental, etc.). The size of the metallic core that is formed from the metal powder is generally 0.5-150 μm (and all values and ranges therebetween), and typically 1-20 μm. The use of processing aids to maintain overall particle size while refining the microstructure to very fine sizes may optionally be required to stabilize the microstructure during processing. To improve the particle properties, particle shapes (flakes, fibers, ribbon) can optionally be used with a short and a long dimension. Thereafter, one or more coatings are applied to the magnetic particles at thicknesses of 1 nm to 1 μm (and all values and ranges therebetween), and typically about 5-100 nm. The coating generally constitutes less than 10 vol. % of the total volume of the coated particle, and typically less than 5 vol. % of the total volume of the coated particle, and more typically less than 2.5 vol. % of the total volume of the coated particle. Generally, the coating constitutes at least 0.05 vol. % of the total volume of the coated particle. When the coating is less than 20 nm thick, exchange coupling and easier magnetization can be achieved between isolated domains. The insulator-coated particles can be consolidated using spark plasma or other field-assisted sintering processing combining rapid heating and pressure to fabricate fully dense cores having high saturation, low coercivity, and low eddy current losses at 0.2-5 MHz.

In another non-limiting aspect of the present disclosure, various processes can be used to apply the one or more coatings to the magnetic particles. Such processes include 1) preceramic-polymer coating and pyrolysis processes to form a coating such as, but not limited to $Si_3N_4$, SiOC, BN, etc., coatings, 2) chemical vapor deposition processes to form a coating such as, but not limited to MgO, AlN, $SiO_2$, BN. etc., coatings, 3) sol-gel processes to form a coating such as, but not limited to $Al_2O_3$, $SiO_2$, $SiO_2$—$B_2O_3$, etc., coatings, and 4) molecular/atomic layer deposition processes to form a coating such as, but not limited to AlN, $Al_2O_3$, $SiO_2$, $SiO_2$—$B_2O_3$, etc., coatings. The one or more coatings can be used to provide high electrical resistance (e.g., >10$^{-5}$ Ω·m) for reducing eddy current losses at higher frequencies (e.g., >20 kHz). The one or more coatings may optionally include high resistance semiconductor coatings which facilitate rapid heating during spark plasma or field-assisted sintering. Such high resistance semiconductors coatings include, but are not limited to, silicon, boron, germanium, gallium-arsenic, gallium-nitrogen, diamond-like carbon, high resistance carbon, resistive oxides, and/or other semiconductor materials.

In another non-limiting aspect of the present disclosure, the magnetic particles can be formed of iron-cobalt alloy; however, other metal alloys can be used. The metal alloys used to form the magnetic particles generally have a very high magnetic saturation. Generally, the magnetic saturation of the metal alloys is above 1.8, typically above 2.0 T (e.g., 2.01-2.3 T, etc.). The metal alloys also generally have very high permittivity (i.e., 100 or greater).

In another non-limiting aspect of the present disclosure, low coercivities of the metal alloy (i.e., no more than 0.3) can optionally be obtained.

In another non-limiting aspect of the present disclosure, B2 ordered and/or disordered BCC structures can optionally be used to improve saturation and coercivity of the magnetic particles.

In another non-limiting aspect of the present disclosure, one non-limiting process for forming the magnetic material includes a) using a CVD, sol-gel, and polymer pyrolysis process to apply 3-100 nm $SiO_2$, MgO, Si, BN, or other insulator coatings onto 20-100 μm metal cores; b) using mechanical and melt processing techniques to produce nano-structured, flake, ribbon, and equiaxed particles; and c) using spark plasma sintering to produce fully dense magnetic cores while retaining the engineered particle structures. These materials, microstructure, techniques and processes produce a magnetic material with high resistance and high saturation magnetic cores which can operate at 200° C.+ at wide band gap semiconductor frequencies, while also providing high thermal conductivity (above 50 W/m-s, and typically above 100-150 W/m-s), and robust mechanical properties (above 5 Ksi, typically above 10 Ksi, and more typically above 20 Ksi tensile and compressive strength). The magnetic material microstructure formed has one or more of the following advantages:

- using micron-sized, isolated particles suspended in an insulator virtually eliminates classical eddy current losses which, when combined with low hysteresis and anomalous (domain wall motion) eddy current losses, results in a very low loss material;
- exceptionally high magnetic saturations and permittivity of metallic materials can be combined with the high resistivities/low losses of ferrite or oxide materials;
- ability to control microstructure through powder shape control and pressing conditions further enhance magnetic and mechanical properties;
- permittivity in the 100s and into the 1000s are achievable in a highly insulating structure—a greater than 2 order of magnitude performance increase; and.
- saturation above 1.8 T is achievable when keeping the insulator volume percent below 5 vol. %, in a mechanically durable system.

In another non-limiting aspect of the present disclosure, the coated particles in accordance with the present disclosure can be used to form a magnetic core that has retention of high saturation value by minimizing the amount of insulator volume needed while maintaining high insulation value and low eddy current losses at high frequencies, and also while maintaining low coercivity/low hysteresis losses by enabling thermal annealing and removing other impediments to domain wall motion within individual magnetic grains.

In another non-limiting aspect of the present disclosure, the coated particles in accordance with the present disclosure can be used to form a magnetic core that enables high saturation (above 1.5 T), and typically above 1.8 or 2 Tesla saturation values.

In another non-limiting aspect of the present disclosure, iron-cobalt-vanadium and Fe—Co-2V alloys (e.g., Fe, 40-49 wt. % Co, 1-10 wt. % V), such as Hiperco, from Carpenter® Technology, supermendur, or other ferromagnetic materials can be used to form the coated particles of the present disclosure to form a magnetic core having a saturation magnetization above 1.8 Tesla, typically above 2 Tesla, or even 2.3 Tesla.

In another non-limiting aspect of the present disclosure, the coated particles of the present disclosure can be produced by grinding, atomization, or other method into particles having dimensions ranging from 0.5-500 μm. For frequencies of 20-500 kHz, coated particles with at least one dimension in the 20-200 μm range can be used.

In another non-limiting aspect of the present disclosure, the core ferromagnetic material can constitute at least 75 vol. % of the final coated particle, and typically at least 80 vol. %, more typically at least 90 vol. %, and even more typically at least 95 vol. %. To achieve such volume percent of the core, micron and nanoscale dielectric insulator coatings on the individual grains can be used. Binders such as an epoxy or polymeric (non-magnetic) binder are generally not used to form the magnetic core.

In another non-limiting aspect of the present disclosure, to reduce hysteresis losses, the magnetic particles can be nanostructured to produce a nanocrystalline material with low coercivity. The nanostructured material may be produced by rapidly solidifying from a melt, or from milling a particle (may be with dispersion aid to stabilize the resultant structure) to create a material with grain sizes less than 100 nm, and typically in the 5-30 nm size range. Alternatively, the particles can be annealed to create single crystal/single domain particles, which can (easy axis) be aligned with the magnetizing field to minimize coercivity.

In another non-limiting aspect of the present disclosure, to minimize eddy current and hysteresis losses, the magnetic particles may also be shaped into flakes to enable high packing density (e.g., >98%) and enable lower coercivity in the field direction. Such particles may be 0.5-10 μm in width, with 20-1000 μm lengths. Such shaping of the particles can be accomplished by crushing, rapidly solidified (melt spun) ribbon, and ball-milling (to create flakes). More ductile materials favor ball milling to create flakes, while brittle materials may be best processed using melt spinning followed by grinding into flakes.

In another non-limiting aspect of the present disclosure, the metal powders used to form high saturation materials can include, but are not limited to, iron-cobalt-vanadium, orthinol, silicon steel, and metallic glasses (2605SC).

In another non-limiting aspect of the present disclosure, to minimize eddy current losses, the magnetic particles can be coated with a thermally stable insulator or semiconducting material to allow consolidation and annealing. The one or more coatings on the magnetic particles can be 1) an inorganic material, such as silica, silicate, silicate glass, BN, BN nanosheets, AlN, $Si_3N_4$, $TiO_2$, titanate, $Al_2O_3$, SiOC, SiAlON, aluminate, aluminosilicate, mica, $B_2O_3$, borosilicate, borate glass, ferromagnetic insulator ($Fe_3O_4$, ($Mn(Fe_2O_4)$, $Zn(Fe_2O_4)$) or other dielectric oxide or nitride or other inorganic dielectric insulating material, and/or 2) semiconductor coatings such as silicon, boron, germanium, antimony, selenium, tellurium, gallium-arsenic, silicon-carbon, sulfides, selenides, and other high resistance materials. If more than one coating is applied to the magnetic particles, the composition of the different coatings can be the same or different. These coatings can be applied at coating thickness of 1-100 nm (and all values and ranges therebetween), and typically 10-30 nm using techniques such as preceramic polymer addition, chemical vapor deposition, atomic layer deposition, physical vapor deposition, solution or sol-gel coating, or other techniques.

In another non-limiting aspect of the present disclosure, a nanosheet (e.g., BN nanosheet (BNNs), etc.) can optionally be applied to the coated particles to further increase the resistance of the composite as well as protect the insulator during sintering process and/or allow for slippage of the particles during consolidation.

In another non-limiting aspect of the present disclosure, a lower glass transition temperature (Tg) of the coating can be used to maintain the integrity of the coating during the sintering process. The lower glass transition temperature (lower than no-modification Tg at least 50° C.) of the coating allows the coating to flow and deform during compaction without breaching during sintering process; thereby protecting the integrity of the coating. The coatings can optionally be formulated to form an amorphous insulator with creep or plastic deformation to protect the coating integrity during the sintering process.

In another non-limiting aspect of the present disclosure, the coating can optionally be doped with glass modifiers (e.g., boron, sodium, and/or calcium additions) to lower the Tg.

In another non-limiting aspect of the present disclosure, to limit the hysteresis loss caused by residual stress, a lower modulus/stiffness insulator such as, but not limited to, boron-nitrogen, BN nanosheet, $Si_3N_4$, and/or $SiO_2$, can be used.

In another non-limiting aspect of the present disclosure, the coating can optionally be plastically deformable at 0.6-0.9 Tm (of the ferromagnetic material) (and all values and ranges therebetween).

In another non-limiting aspect of the present disclosure, the coating can optionally have a melting temperature that is significantly above that of the ferromagnetic particle (e.g., 100+° C. above the melting point of the ferromagnetic particle, 200+° C. above the melting point of the ferromagnetic particle, 300+° C. above the melting point of the ferromagnetic particle, 400+° C. above the melting point of the ferromagnetic particle); also, the coating can optionally have a metaling point that is lower than the melting temperature of glass (e.g., 1400-1600° C.). The higher melting material of the coating is configured to withstand the increased temperatures at the interfaces during resistive heating.

In another non-limiting aspect of the present disclosure, a high rate process can be used to consolidate the engineered magnetic particles together to retain their engineered structure. One non-limiting method for forming a core material from the coated magnetic particles is by spark plasma sintering. Spark plasma sintering, wherein an electric field is imposed to heat the coated particles while simultaneously applying pressure (normally in a graphite die), can be used for the rapid consolidation technique. By shortening the total processing time at elevated temperatures to 60 minutes or less, generally less than 20 or 30 minutes, and typically to less than 10 minutes, diffusional processes are inhibited/prevented, thereby enabling retention of fine nano-sized-structures engineered into the nanostructured magnetic particles. The rapid consolidation process includes heating the coated magnetic particles quickly, such as by electrical heating using DC, pulsed, AC, or RF frequencies to a temperature between 0.5-0.9 Tm, and normally to between 0.75-0.85 Tm (melting temperature) of the metallic phase. The coated magnetic particles are generally heated to a temperature where deformation is able to be accomplished at relatively low stress (generally below 120 MPa, and normally below 60-80 MPa, and even as low as 20-40 MPa) to enable the coated particles to be deformed into a space-filling array within the strength limits of graphite dies. Higher stresses may be imposed using carbide (normally tungsten-carbon, but may be silicon-carbon) die materials.

In another non-limiting aspect of the present disclosure, a non-limiting processing sequence in accordance with the present disclosure is to fill a die (generally graphite) with the engineered magnetic powders (which may be preformed to assist in loading or to structure the material, such as a graded or laminated structure having several layers or gradations of composition). A pressure is applied to the preform/powder bed, such as by hydraulically compressing the upper and/or lower die. The engineered magnetic powders can be heated by the application of an electric field/current, receiving heating from the graphite die, and/or self-heating through internal resistance. The heating is applied until a specified temperature is obtained. The heating profile can include one or more intermediate holds to allow for removal of gasses, conversion of coating systems (such as from preceramic polymers), reaction of particle surfaces (e.g., oxidation of an intermediate coating, reduction or cleaning, or other surface-gas interaction or reaction), after which pressure and/or temperature may be further increased to the final set point. At the final set point, the engineered magnetic powders are held for a sufficient time to maximize the deformation (space filling) of the engineered magnetic powders, and to enable bonding of the particles into a solid material. The consolidated magnetic material is then removed from the die after cooling sufficiently. The processing time is normally less than one hour, generally less than thirty minutes, and often less than 5 or 10 minutes per cycle. After consolidation, the consolidated magnetic material can optionally be annealed to remove stresses at an intermediate temperature. Annealing can also include field annealing to align the easy magnetization axis with the field and to control the domain structure, followed by cooling to "lock-in" the desired magnetic domain structure. For the thermal annealing, the anneal the materials can be performed at different temperatures (e.g., 550° C., 600° C.) for various time periods (1 hr., 2 hr., 4 hr.) in an inert atmosphere (e.g., argon atmosphere). For the magnetic field annealing, the magnetic flux density (e.g., 0.3-1 T) to the sample can be performed at 150-250° C. for 15-350 s.

One non-limiting object of the present disclosure is the provision of a low loss, high MSat (magnetic saturation) magnetic material having a saturation magnetization of greater than 1.5 T and low core losses (e.g., power density<2000 $kW/m^3$) at frequencies above 5 KHz.

Another and/or alternative non-limiting object of the present disclosure is the provision of a magnetic material that is formed from a plurality of magnetic particles of 20-1500 μm (and all values and ranges therebetween) in size having a saturation magnetization above 1.5 T.

Another and/or alternative non-limiting object of the present disclosure is the provision of a magnetic material that is formed from a plurality of magnetic particles that are structured and engineered to have low coercivity.

Another and/or alternative non-limiting object of the present disclosure is the provision of a magnetic material that is formed from a plurality of magnetic particles that have a thermally-stable coating (e.g., dielectric coating, etc.).

Another and/or alternative non-limiting object of the present disclosure is the provision of a magnetic material that is formed from a plurality of magnetic particles having a thermally-stable coating with a melting point above 350° C.

Another and/or alternative non-limiting object of the present disclosure is the provision of a magnetic material that is formed from a plurality of magnetic particles having a thermally-stable coating of a thickness of 5-200 nm (and all values and ranges therebetween).

Another and/or alternative non-limiting object of the present disclosure is the provision of a magnetic material that is formed from a plurality of coated magnetic particles that have been consolidated using rapid heating and pressure into a mass over 90% of theoretical density of the coated particles to form the magnetic material.

Another and/or alternative non-limiting object of the present disclosure is the provision of a magnetic material that is formed from a plurality of magnetic particles that are formed of iron, iron alloy, iron-silicon alloy, glassy iron alloy, iron-nickel alloy, and/or iron-cobalt alloy.

Another and/or alternative non-limiting object of the present disclosure is the provision of a magnetic material that is formed from a plurality of coated magnetic particles wherein the coating includes a high melting point insulator material above 800° C.

Another and/or alternative non-limiting object of the present disclosure is the provision of a magnetic material that is formed from a plurality of coated magnetic particles wherein the coating includes PEEK, polyimide, polyphenyl sulfone, polysiloxane, silicone, polysilizane, phenolic and/or a polymeric material having a use temperature above 280° C.

Another and/or alternative non-limiting object of the present disclosure is the provision of a magnetic material that is formed from a plurality of coated magnetic particles wherein the coating includes a semiconducting or other low conductivity material.

Another and/or alternative non-limiting object of the present disclosure is the provision of a magnetic material that is formed from a plurality of coated magnetic particles wherein the coating includes ferrite, silicon metal, germanium metal, glassy carbon, boron, arsenide, selenide, or other high resistivity metallic or semiconducting material.

Another and/or alternative non-limiting object of the present disclosure is the provision of a magnetic material that is formed from a plurality of coated magnetic particles wherein the coating includes an inorganic material.

Another and/or alternative non-limiting object of the present disclosure is the provision of a magnetic material that is formed from a plurality of coated magnetic particles wherein the coating includes silica, silicate, silicate glass, includes silica, silicate, silicate glass, BN, BN nanosheets, AlN, $Si_3N_4$, $TiO_2$, titanate, $Al_2O_3$, SiOC, SiAlON, aluminate, aluminosilicate, mica, $B_2O_3$, borosilicate, borate glass, ferromagnetic insulator ($Fe_3O_4$, ($Mn(Fe_2O_4)$, $Zn(Fe_2O_4)$)) or other dielectric oxide or nitride or other inorganic dielectric insulating material.

Another and/or alternative non-limiting object of the present invention is the provision of a magnetic material that is formed from a plurality of coated magnetic particles with an inorganic coating such as a BN nanosheet (BNNs) to further increase the resistance of the composite, protect the insulator during sintering process, and allow for slippage of the particles during consolidation.

Another and/or alternative non-limiting object of the present invention is the provision of a magnetic material that is formed from a plurality of coated magnetic particles with an inorganic coating with a lower glass transition temperature (Tg), thereby allowing the coating to flow and deform during compaction without breaching during sintering process so as to protect the integrity of the coating. The coating can optionally be doped with glass modifiers (boron, sodium, and/or calcium additions) to lower the Tg. In addition, the amorphous insulator with creep or plastic deformation can also be developed to protect the coating integrity during the sintering process.

Another and/or alternative non-limiting object of the present disclosure is the provision of a magnetic material that is formed from a plurality of coated magnetic particles wherein the coated magnetic particles have a first dimension in the 0.5-20 μm size range (and all values and ranges therebetween), and a second dimension 10-5000× (and all values and ranges therebetween) greater than the first dimension.

Another and/or alternative non-limiting object of the present disclosure is the provision of a magnetic material that is formed from a plurality of coated magnetic particles having a non-spherical shape such as a football, flake, fiber, or other engineered shape.

Another and/or alternative non-limiting object of the present disclosure is the provision of a magnetic material that is formed from a plurality of coated magnetic particles having a spherical shape.

Another and/or alternative non-limiting object of the present disclosure is the provision of a magnetic material that is formed from a plurality of coated magnetic particles wherein the magnetic material is used as part of a power system such as, but not limited to, a power converter, power supply, pulse forming network, inverter, rectifier, motor controller system, or as part of a transformer, choke, inductor, or filter circuit.

In another and/or alternative non-limiting object of the present disclosure is the provision of a magnetic material that is formed from a plurality of coated magnetic particles wherein the magnetic material is used as part of a power system that operates at a frequency above 50 KHz, typically above 200 KHz, and more typically above 500 KHz.

In another and/or alternative non-limiting object of the present disclosure is the provision of a magnetic material that is formed from a plurality of coated magnetic particles wherein the magnetic material is used as part of a power system that includes a wide band gap semiconductor such as, but not limited to, a silicon-cobalt or a gallium-nitrogen power electronic component.

Another and/or alternative non-limiting object of the present disclosure is the provision of a magnetic material that is formed from a plurality of coated magnetic particles wherein the magnetic material is annealed to relive residual stresses with or without a field to align the easy magnetic axis.

Another and/or alternative non-limiting object of the present disclosure is the provision of a magnetic material that is formed from a plurality of coated magnetic particles wherein the magnetic material is formed by a high rate consolidation process that includes field-assisted sintering or spark plasma sintering.

In another and/or alternative non-limiting object of the present disclosure is the provision of a magnetic material that is formed from a plurality of coated magnetic particles wherein the magnetic material is formed by a high rate consolidation process that includes one or more holding steps and/or controlled heating steps to debind, degas, react, pyrolize, or otherwise alter the chemistry of the material.

In another and/or alternative non-limiting object of the present disclosure is the provision of a magnetic material that is formed from a plurality of coated magnetic particles wherein the magnetic material is formed by a high rate consolidation process wherein the environment is controlled during rapid consolidation by use of a vacuum, reducing, oxidizing, nitriding, and/or other controlled environment.

In another and/or alternative non-limiting object of the present disclosure is the provision of a magnetic material that is formed from a plurality of coated magnetic particles wherein the magnetic material is formed by a high rate consolidation process wherein the peak temperature during the consolidation process is selected to be 60-95% (and all values and ranges therebetween) of the melting point of the ferromagnetic material, and 30-200% (and all values and ranges therebetween) of the melting or decomposition point of the insulating coating.

These and other advantages of the present invention will become more apparent to those skilled in the art from a review of the description of the preferred embodiment and claims.

BRIEF DESCRIPTION OF THE DRAWINGS

Reference may now be made to the drawings, which illustrate various embodiments that the invention may take in physical form and in certain parts and arrangements of parts wherein.

DETAILED DESCRIPTION OF THE DISCLOSURE

Figure 1:
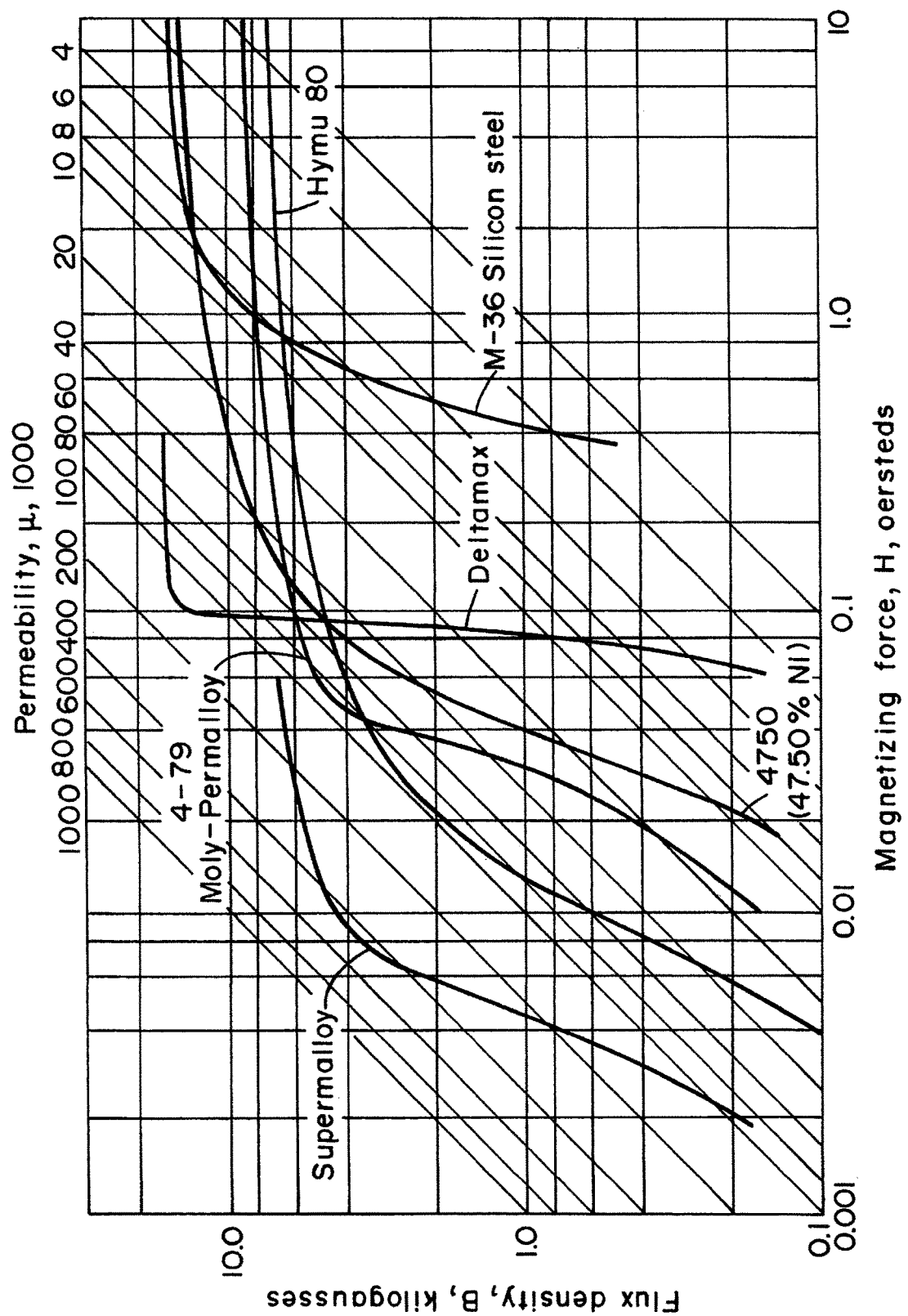
FIG. 1 illustrates typical DC magnetization curves for common magnetic materials.
Figure 2:
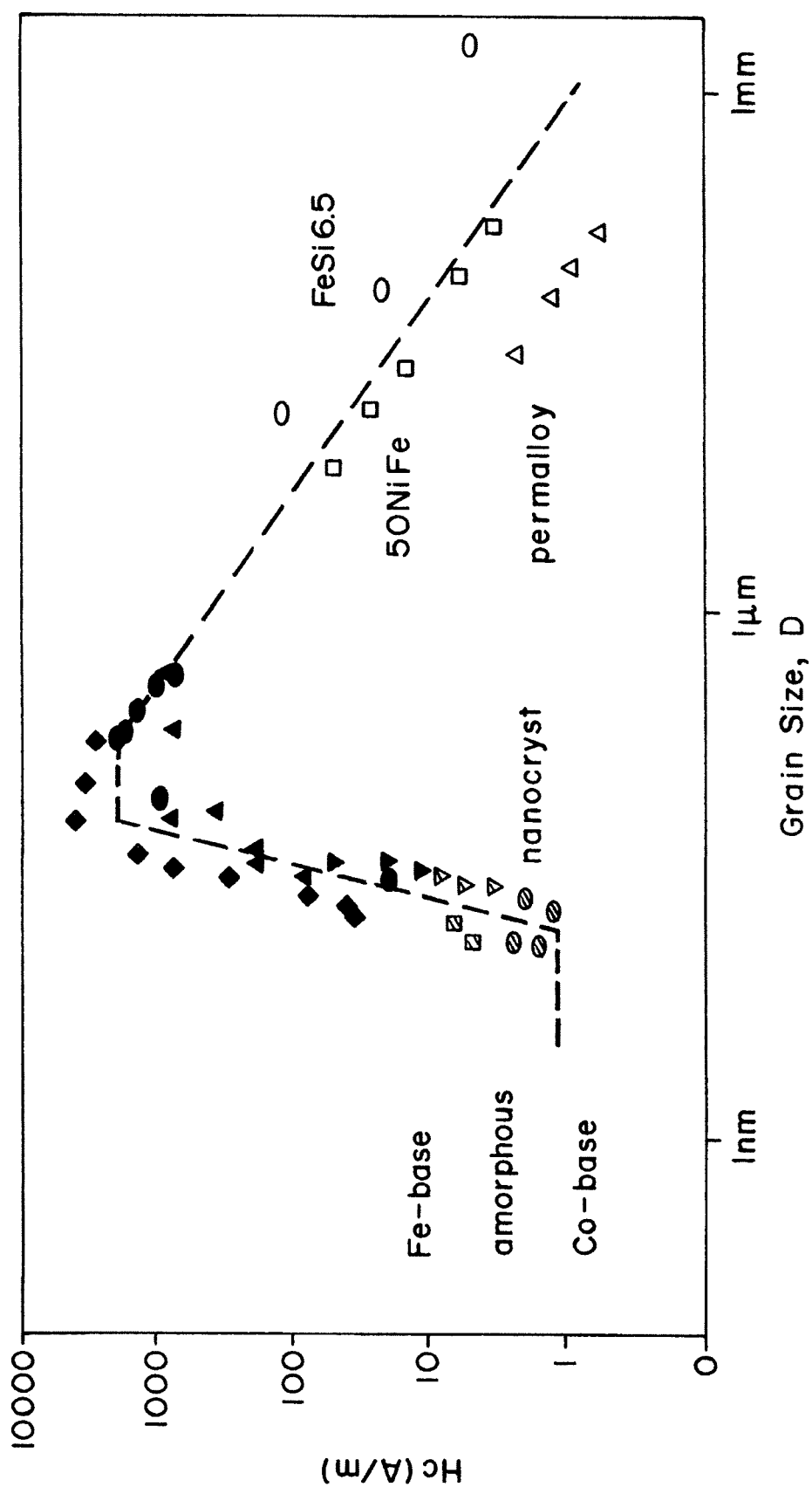
FIG. 2 illustrates coercivities as a function of grain size for conventional and nanocrystalline soft magnetic alloys.

A more complete understanding of the articles/devices, processes, and components disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any unavoidable impurities that might result therefrom, and excludes other ingredients/steps.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values).

The terms "about" and "approximately" can be used to include any numerical value that can vary without changing the basic function of that value. When used with a range, "about" and "approximately" also disclose the range defined by the absolute values of the two endpoints, e.g. "about 2 to about 4" also discloses the range "from 2 to 4." Generally, the terms "about" and "approximately" may refer to plus or minus 10% of the indicated number.

Percentages of elements should be assumed to be percent by weight of the stated element, unless expressly stated otherwise.

The high saturation, low loss magnetic materials in accordance with the present disclosure can be nano-engineered iron-cobalt alloys that are formed into ferrite-type microstructures with insulating grain boundaries by using particle coating and spark plasma sintering, The iron-cobalt alloys can optionally include metals such a vanadium, nickel, etc. As can be appreciated, other metal alloys can be used (e.g., iron, iron-silicon alloys, glassy iron alloy, iron-nickel alloy, etc.) for the magnetic material. Specifically, the addition of nanometer/submicron-layer insulator coatings onto particles which retain their structure through consolidation using field assisting sintering techniques can be used to create artificially engineered magnetic structures. These designer nanostructures are useful for the production of solid soft magnetic cores for wide band gap power semiconductor conversion applications.

The particles in accordance with the present disclosure enable the production of magnetic materials capable of operating at a frequency greater than 200 kHz at an ambient operating temperature of up to 200° C. or more, with an allowable temperature rise of 50-100° C. (and all values and ranges therebetween).

The resultant magnetic materials in accordance with the present disclosure have the following properties:
  operating frequency of 200 kHz-5 MHz (and all values and ranges therebetween) (low eddy current losses at 0.2-5 MHz);
  200° C.+ operating temperatures;
  >1.8 T saturation at 200° C.; and
  100+ permeability.

Magnetic alloys (e.g., iron-cobalt alloys, etc.) in accordance with the present disclosure are modified to increase their frequency capability in solid cores by creating a ferrite-like microstructure of insulating grain boundaries using particle nano-engineering technology.

Two complimentary techniques can be used to create the desired magnetic materials in accordance with the present disclosure.

Technique A

Insulating dielectric coatings are applied to 0.5-1500 μm (and all values and ranges therebetween), and typically 2-50 μm, high magnetic saturation metal powders (e.g., iron-cobalt alloys, iron, iron-silicon alloys, iron-nickel alloys, etc.) using a) fluidized bed chemical vapor deposition, b) preceramic-polymer coating and pyrolysis, atomic or molecular layer deposition, or c) sol-gel/solution techniques. The insulator-coated particles are consolidated into the magnetic material using spark plasma or other field-assisted sintering processing combining rapid heating and pressure to fabricate fully dense cores having high saturation, low coercivity, and low eddy current losses at 0.2-5 MHz, and the magnetic material has a theoretical density of greater than 80%, typically greater than 90%, and more typically greater than 95%.

Technique B

The high saturation magnetic cores formed from magnetic powders (e.g., iron-cobalt alloy powders, etc.) can be nanostructured using rapid solidification or mechanical alloying techniques to refine their grain structure to 5-50 nm in size so as to reduce coercivity. The metal powder generally is 1-200 μm (and all values and ranges therebetween), and typically 2-100 μm. The metal powder is coated and then bonded together by any number of techniques (e.g., melt atomization, rapid solidification (such as melt-spinning), blended elemental, etc.). The size of the formed metallic core that is formed from the metal powder is generally 0.5-150 μm (and all values and ranges therebetween), and typically 1-20 μm. The use of processing aids to maintain overall particle size while refining the microstructure to very fine sizes may optionally be required to stabilize the microstructure during processing. To improve the particle properties, particle shapes (flakes, fibers, ribbon) can optionally be used with a short and a long dimension.

For both of the above two techniques, various processes can be used to apply the one or more coatings to the magnetic particles, including: 1) preceramic-polymer coating and pyrolysis processes to form a coating such as, but not limited to $Si_3N_4$, SiOC, BN, etc. coatings; 2) chemical vapor deposition processes to form a coating such as, but not limited to MgO, AlN, $SiO_2$, BN, etc., coatings; 3) sol-gel processes to form a coating such as, but not limited to $AlO_3$, $SiO_2$, $SiO_2$—$B_2O_3$, etc., coatings; and 4) molecular/atomic layer deposition processes to form a coating such as, but not limited to AlN, $Al_2O_3$, $SiO_2$, $SiO_2$—$B_2O_3$, etc., coatings. The one or more coatings provide high electrical resistance for reducing eddy current losses at higher frequencies. The one or more coatings may include high resistance semiconductor coatings which facilitate rapid heating during spark plasma or field-assisted sintering. Such high resistance semiconductors coatings include silicon, boron, germanium, gallium-arsenic, gallium-nitrogen, diamond-like carbon, high resistance carbon, resistive oxides, and/or other semiconductor materials.

The one or more coatings on the magnetic particles are applied at thicknesses of 1 nm to 1 μm (and all values and ranges therebetween), and typically about 5-100 nm. The coating generally constitutes less than 10 vol. % of the total volume of the coated particle, and typically less than 5 vol. % of the total volume of the coated particle, and more typically less than 2.5 vol. % of the total volume of the coated particle. Generally, the coating constitutes at least 0.05 vol. % of the total volume of the coated particle. When the coating is less than 20 nm thick, exchange coupling and easier magnetization can be achieved between isolated domains.

Figure 3:
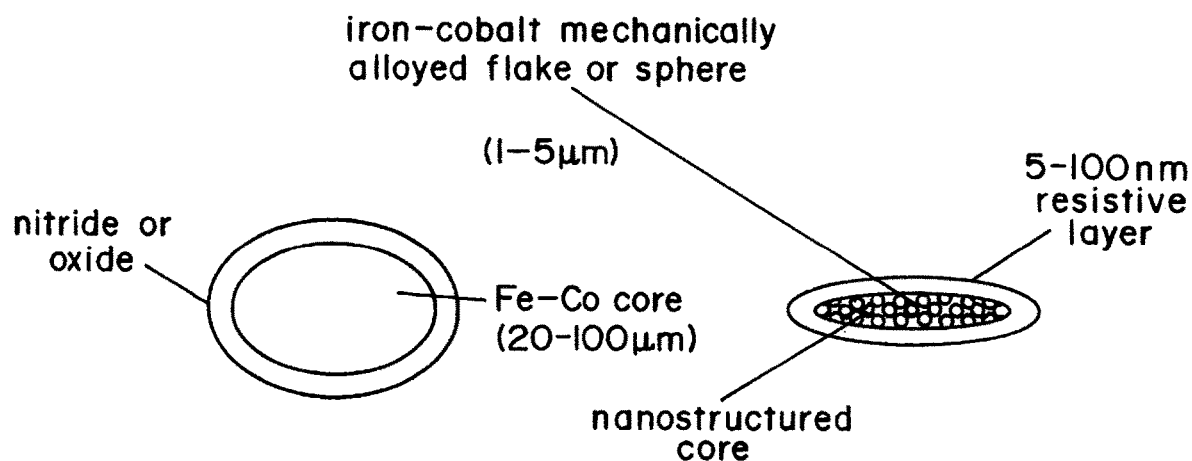
FIG. 3 illustrates two non-limiting embodiments of this particle coating concept in accordance with the present disclosure.

In one non-limiting embodiment, the magnetic particles are formed of iron-cobalt alloy; however, other metal alloys can be used. The metal alloys used to form the magnetic particles generally have a very high magnetic saturation. Generally, the magnetic saturation of the metal alloys is above 1.8, typically above 2.0 T (e.g., 2.01-2.3 T, etc.). The metal alloys also have very high permittivity. Low coercivities of the metal alloy can also be obtained. B2 ordered and/or disordered BCC structures can optionally be used to improve saturation and coercivity of the magnetic particles. Two non-limiting embodiments of this particle coating concept in accordance with the present disclosure are illustrated in FIG. 3.

Processing sequences include:

A. Use of CVD, sol-gel, and polymer pyrolysis conditions to apply 3-100 nm thick coating of $SiO_2$, MgO, Si, BN, or other insulator coatings onto 20-100 μm metal powder particles or cores;

B. Optionally use mechanical and/or melt processing techniques to produce nanostructured, flake, ribbon, and equiaxed particles; and C. Use spark plasma sintering or other types of sintering processes to produce fully dense magnetic cores while retaining the engineered particle structures.

These materials, microstructures, techniques and processes produce a magnetic material with high resistance and high saturation magnetic cores which can operate at 200° C.+ at wide band gap semiconductor frequencies, while also providing high thermal conductivity (above 50 W/m-s, and typically above 100-150 W/m-s), and having robust mechanical properties (above 5 Ksi, typically above 10 Ksi, and more typically above 20 Ksi tensile and compressive strength).

The magnetic material microstructure formed in accordance with the present disclosure creates the following advantages:

using micron-sized, isolated particles suspended in an insulator virtually eliminates classical eddy current losses which, when combined with low hysteresis and anomalous (domain wall motion) eddy current losses, results in a very low loss material;

exceptionally high magnetic saturations and permittivity of metallic materials can be combined with the high resistivities/low losses of ferrite or oxide materials;

the ability to control microstructure through powder shape control and pressing conditions further enhances the magnetic and/or mechanical properties;

permittivity in the 100s and into the 1000s are achievable in a highly insulating structure—a greater than 2 order of magnitude performance increase; and saturation above 1.8 T is achievable when keeping the insulator volume percent below 5 vol. %, in a mechanically durable system.

The coated particles in accordance with the present disclosure can be used to form a core that has retention of high saturation value by minimizing the amount of insulator volume needed while maintaining high insulation value and low eddy current losses at high frequencies, and maintaining low coercivity/low hysteresis losses by enabling thermal annealing and removing other impediments to domain wall motion within individual magnetic grains.

The coated particles in accordance with the present disclosure can be used to form a core that enables high saturation, above 1.5 T, and typically above 1.8 or 2 Tesla saturation values. Iron-cobalt-vanadium and Fe—Co-2V alloys (e.g., Fe, 40-49 wt. % Co, 1-10 wt. % V), such as Hiperco, from Carpenter® Technology, supermendur, or other ferromagnetic materials can be used to form the coated particles of the present disclosure that have a saturation magnetization above 1.8 Tesla, typically above 2 Tesla or even 2.3 Tesla. The coated particles of the present disclosure can be produced by grinding, atomization, or other method to particles having dimensions ranging from 0.5-500 μm. For frequencies of 20-500 KHz, particles with at least one dimension in the 20-200 μm range are desirable. The core ferromagnetic material should constitute at least 75 vol. % of the final coated particle, and typically at least 80 vol. %, more typically at least 90 vol. %, and even more typically at least 95 vol. %. To achieve such volume percent of the core, micron- and nanoscale-dielectric insulator coatings on the individual grains are used. Binders such as an epoxy or polymeric (non-magnetic) binder are generally not used.

To reduce hysteresis losses, the magnetic particles can be nanostructured to produce a nanocrystalline material with a low coercivity. The nanostructured material may be produced by rapidly solidifying the metal alloy from a melt, or by milling a metal alloy particle (optionally using a dispersion aid to stabilize the resultant structure) to create a metal alloy particle having grain sizes of less than 100 nm, and typically in the 5-30 nm size range. Alternatively, the metal alloy particles can be annealed to create single-crystal/single-domain particles, which can be aligned (easy axis) with the magnetizing field to minimize coercivity.

To minimize eddy current and hysteresis losses, the particles may also be shaped into flakes to enable high packing density and enable lower coercivity in the field direction. Such particles may be 0.5-10 μm in width, with 20-1000 μm in length.

Crushed, rapidly solidified (melt spun) metal ribbon, as well as ball-milled metal powders (to create flakes) are processes that can be used to form high saturation materials from materials such as iron-cobalt-vanadium, orthinol, silicon steel, and metallic glasses (2605SC).

More ductile materials favor ball milling to create flakes, while brittle materials may be best processed using melt spinning followed by grinding into flakes.

To minimize eddy current losses, the primary magnetic particles are coated with a thermally stable (to allow consolidation and annealing) insulator or semiconducting material. The coating on the magnetic particle can be an inorganic material, such as silica, silicate, silicate glass, BN, BN nanosheets, AlN, $Si_3N_4$, $TiO_2$, titanate, $Al_2O_3$, SiOC, SiAlON, aluminate, aluminosilicate, mica, $B_2O_3$, borosilicate, borate glass, ferromagnetic insulator ($Fe_3O_4$, ($Mn(FeO_4)$, $Zn(Fe_2O_4)$) or other dielectric oxide or nitride or other inorganic dielectric insulating material. Semiconductor coatings are also effective, such as silicon, boron, germanium, antimony, selenium, tellurium, gallium-arsenic, silicon-carbon, sulfides, selenides, and other high resistance materials. These coatings can be applied in 1-100 nm, and typically 10-30 nm thickness using techniques such as preceramic polymer addition, chemical vapor deposition, atomic layer deposition, physical vapor deposition, solution or sol-gel coating, or other techniques. In addition, a nanosheet, for example, BN nanosheet (BNNs) can be applied to the coated particles to further increase the resistance of the magnetic material, protect the insulator during the sintering process, and allow for slippage of the particles during consolidation.

In order to maintain the integrity of the coating during the sintering process, a lower glass transition temperature (Tg) will allow the coating to flow and deform during compaction without breaching during sintering process, then protect the integrity of the coating. The coating can be doped with glass modifiers (boron, sodium, and/or calcium additions) to lower the Tg. In addition, the amorphous insulator with creep or plastic deformation can also be created to protect the coating integrity during the sintering process.

To limit the hysteresis loss caused by residual stress, a lower modulus/stiffness insulator, such as boron-nitrogen, can be used. The coating being optionally plastically deformable at 0.6-0.9 Tm (of the ferromagnetic material) is desirable. The coating generally has a melting temperature that is significantly above that of the ferromagnetic particle; however, a lower melting temperature material such as a glass may be used. The higher melting material of the coating withstands the increased temperatures at the interfaces during resistive heating.

A high process rate can be used to consolidate the engineered magnetic particles together to retain their engineered structure. One non-limiting method for forming a core material from the coated magnetic particles is spark plasma sintering. Spark plasma sintering, in which an electric field is imposed to heat the sample while simultaneously applying pressure, normally using a graphite die, can be used for the rapid consolidation technique. By shortening the total processing time at elevated temperatures to 60 minutes or less, generally less than 20 or 30 minutes, and typically to less than 10 minutes, diffusional processes are inhibited/prevented, thereby enabling retention of fine (nano) structures engineered into the nanostructured magnetic particles. The rapid consolidation process involves heating the coated magnetic particles very quickly, such as by electrical heating using DC, pulsed, AC, or RF frequencies to a temperature between 0.5-0.9 Tm, and normally to between 0.75-0.85 Tm (melting temperature) of the metallic phase. The coated magnetic particles are generally heated to a temperature where deformation is able to be accomplished at relatively low stress (generally below 120 MPa, and normally below 60-80 MPa, and even as low as 20-40 MPa) to enable the particles to be deformed into a space-filling array within the strength limits of graphite dies. Higher stresses may be imposed using carbide (normally tungsten-carbon but may be silicon-carbon) die materials.

A non-limiting processing sequence in accordance with the present disclosure is to fill a die (generally graphite) with the engineered magnetic powders (which may be preformed to assist in loading or to structure the material, such as a graded or laminated structure having several layers or gradations of composition). A pressure is applied to the preform/powder bed, such as by hydraulically compressing the upper and/or lower die. The material can be heated by the application of an electric field/current, receiving heating from the graphite die, and/or self-heating through internal resistance. The heating is applied until a specified temperature is met. The heating profile can include one or more intermediate holds to allow for removal of gasses, conversion of coating systems (such as from preceramic polymers), reaction of particle surfaces (e.g., oxidation of an intermediate coating, reduction or cleaning, or other surface-gas interaction or reaction), after which pressure and/or temperature may be further be increased to the final set point. At the final set point, the material is held for a sufficient time to maximize the deformation (space filling) of the particles, and to enable bonding of the particles into a solid material.

The consolidated magnetic material is then removed from the die after cooling sufficiently. The processing time is normally less than one hour, generally less than thirty minutes, and often less than 5 or 10 minutes per cycle.

After consolidation, the magnetic material can be annealed to remove stresses at an intermediate temperature. Annealing can also include field annealing to align the easy magnetization axis with the field and to control the domain structure, followed by cooling to "lock-in" the desired magnetic domain structure.

EXAMPLE 1

Iron-cobalt-vanadium powder (iron—48% Co—2% vanadium) with a particle size of −270/+400 mesh is coated with 20 nm of $SiO_2$ using a sol-gel coating process. The coated iron-cobalt-vanadium powders were consolidated to form a magnetic core by using spark plasma sintering in a graphite die, at a pressure of 50 MPa and a peak temperature of 1100° C. for 20 minutes. The formed magnetic core had a saturation magnetization of 2.1 T, and a high resistivity.

EXAMPLE 2

Iron-cobalt-vanadium powder having a particle size of −230/+325 mesh was mechanically alloyed to create a nanostructured microstructure by attrition milling using 10 mm steel balls in a union process 01HD mill for 20 hours, with the addition of 2 wt. % of nano-$Y_2O_3$ to stabilize the microstructure. The resultant particles were coated with 20 nm of silica using a sol-gel process and consolidated as in Example 1 using spark plasma sintering.

EXAMPLE 3

In order to further increase the resistance of the composite as well as protect the insulator during sintering process, and allow for slippage of the particles during consolidation, boron nitride nanosheets (BNNS's) applied to the coated particles of Examples 1, 2 and 4-6 to improve the resistance and protection layer during sintering process by electrophoretic (controlled surface/isoelectronic charge) coating onto the insulator-coated magnetic cores. A zeta potential analyzer was used to determine charge density and isoelectronic points, and a titration as used to coat the BNNS onto the magnetic core particles. The effect of the coating on the resistance of the particles (Fe, $SiO_2$/Fe, BNNs/$SiO_2$/Fe) was tested under 300 MPa for five minutes. The resistance of the compressed samples was tested directly through multimeter. By coating $SiO_2$ thin films onto the surface, the resistance can be increase for thousand times. By further coating BNNSs onto $SiO_2$/Fe powder, the resistance was improved by 106 times. It was demonstrated that the resistance of the particle can be highly increased by coating insulator $SiO_2$ and further BNNs coating on surface.

EXAMPLE 4

In order to maintain the integrity of the coating during the sintering process, lower glass transition temperature (Tg) allows the coating to flow and deform during compaction without breaching during sintering process, then protect the integrity of the coating. The silica Tg is related to the composition, such as $Na_2O$, MgO, and $Al_2O_3$. By combining a different oxide or element into the silica, the Tg can be decreased. The addition of trimethylborate and sodium hydroxide to the silica sols produce modified silicates with controllable melting points. $B_2O_3$ is a highly viscous glass; $SiO_2$—$B_2O_3$—NaO glasses have viscosities that can be controlled at consolidation temperatures, allowing them to flow and conform to the particles. During CVD, atomic deposition and sol-gel method process, doping $SiO_2$ with different elements (for example, sodium, magnesium, aluminum) was used to low the glass transition temperature. The process of modifying the coating can be used in Examples 1-3, 5 and 6.

EXAMPLE 5

−270/+400 mesh Fe—Co—V particles were coated with 150-200 nm of silicon metal using the decomposition of silane in a fluidized bed CVD reactor at 650° C. The resultant silica-coated magnetic particles were consolidated using spark plasma sintering at 1250° C. and 60 MPa force to form a high resistivity magnetic core.

EXAMPLE 6

30-50 µm iron powder was coated with 100 nm of $SiO_2$ using the decomposition of tetraethylorthosilicate (TEOS) at 600° C. in a fluidized bed reactor. The coated powders were consolidated at 950° C. using a powder forging rapid consolidation technique consisting of heating rapidly in an external preheated furnace, and then consolidating at very high pressures using mechanical compaction in a powder bed (80 tons/sq. inch) to form a magnetic core.

Figure 4:
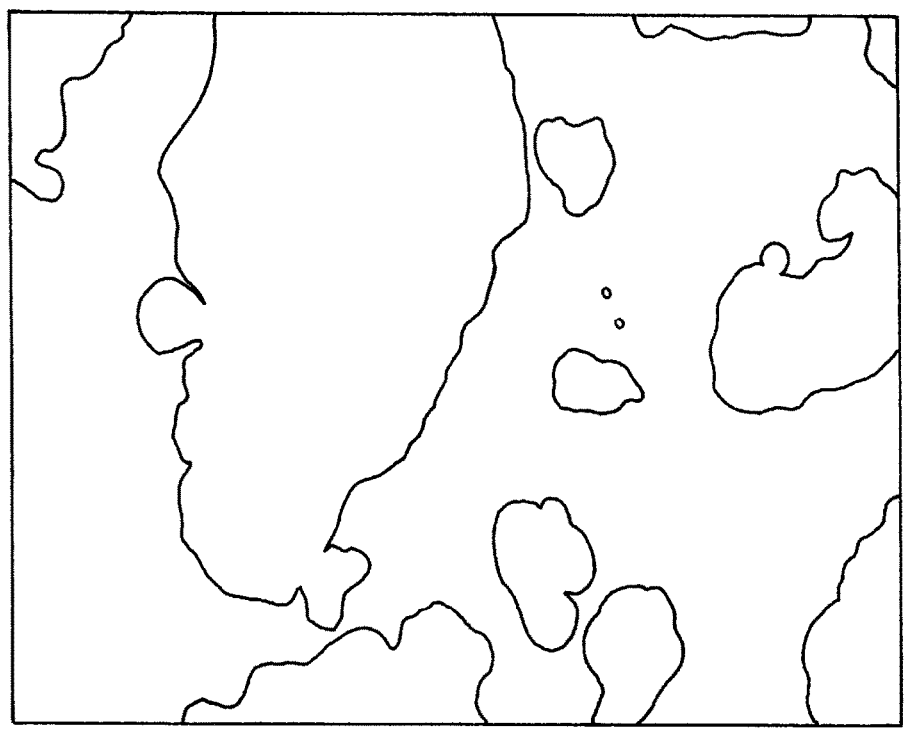
FIG. 4 illustrates silica-coated iron powders.
Figure 5:
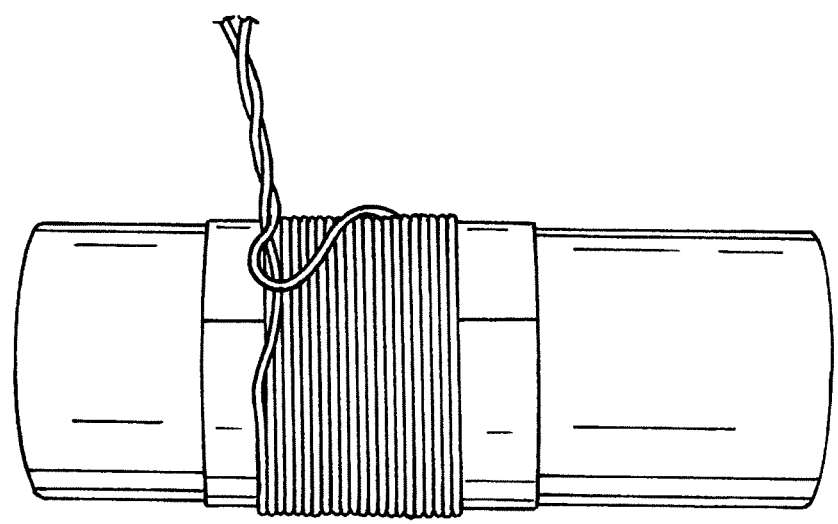
FIG. 5 illustrates a test core fabricated in accordance with Example 4.
Figure 6:
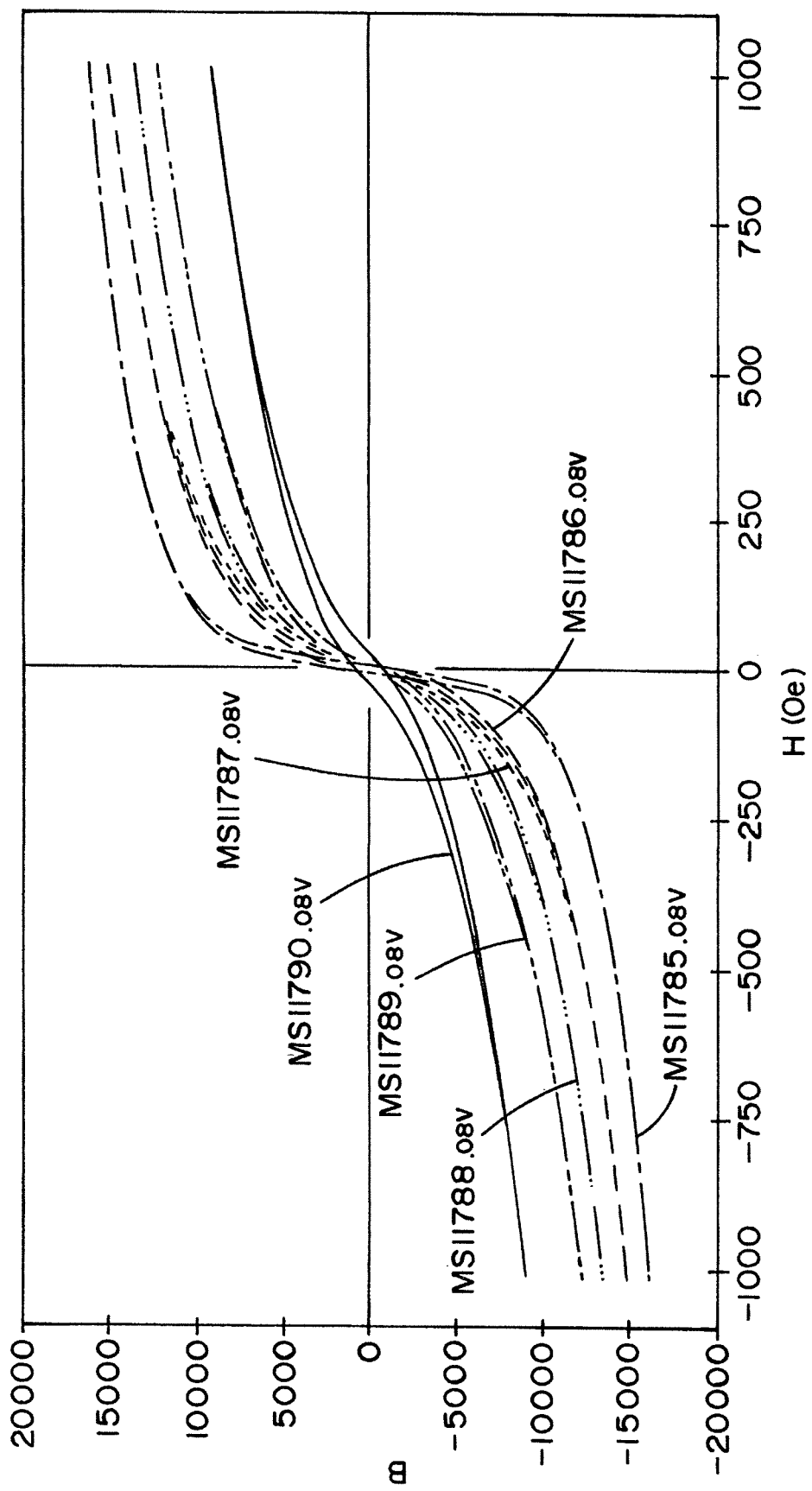
FIG. 6 illustrates the B—H curves of the core of FIG. 5 measured for $SiO_2$ coated iron powders showing saturation at over 1.5 T at room temperature, and coercivities in the <100 Oe range.

FIG. 4 illustrates silica-coated iron powders. A test core fabricated in accordance with Example 4 is illustrated in FIG. 5. FIG. 6 illustrates the B—H curves of the core of FIG. 5 measured for $SiO_2$-coated iron powders showing saturation at over 1.5 T at room temperature and coercivities in the <100 Oe range.

It will thus be seen that the objects set forth above, among those made apparent from the preceding description, are efficiently attained, and since certain changes may be made in the constructions set forth without departing from the spirit and scope of the disclosure, it is intended that all matter contained in the above description and shown in the accompanying drawings shall be interpreted as illustrative and not in a limiting sense. The disclosure has been described with reference to preferred and alternate embodiments. Modifications and alterations will become apparent to those skilled in the art upon reading and understanding the detailed discussion of the disclosure provided herein. This disclosure is intended to include all such modifications and alterations insofar as they come within the scope of the present disclosure. It is also to be understood that the following claims are intended to cover all of the generic and specific features of the disclosure herein described and all statements of the scope of the disclosure, which, as a matter of language, might be said to fall there between. The disclosure has been described with reference to the preferred embodiments. These and other modifications of the preferred embodiments as well as other embodiments of the disclosure will be obvious from the disclosure herein, whereby the foregoing descriptive matter is to be interpreted merely as illustrative of the disclosure and not as a limitation. It is intended to include all such modifications and alterations insofar as they come within the scope of the appended claims.

What is claimed:

1. A low loss, high magnetic saturation magnetic material having a saturation magnetization above 1.5 T and a power density of less than 2000 kW/m$^3$ at frequencies above 5 KHz, said material formed from a plurality of magnetic particles having an average particle size of 20-1500 μm and having a saturation magnetization above 1.5 T, said magnetic particles structured and engineered to have low coercivity of less than <10 Oersted, said particles including a thermally-stable coating, said thermally-stable coating having a melting point above 350° C. and a thickness of 5-200 nm, said coated magnetic particles consolidated by a sintering process using rapid heating and pressure to formed said low loss, high magnetic saturation magnetic material that has a density that is greater than 90% of theoretical density of said particles used to form said low loss, high magnetic saturation magnetic material.

2. The material defined in claim 1, wherein said magnetic particles are iron, iron-silicon, glassy iron, iron-nickel, and/or iron-cobalt alloy.

3. The material as defined in claim 1, wherein said coating includes a high melting point insulator material that has a melting point of greater than 800° C.

4. The material as defined in claim 1, wherein said coating includes PEEK, polyimide, polyphenyl sulfone, polysiloxane, silicone, polysilizane, phenolic, and/or a polymeric material.

5. The material as defined in claim 1, wherein said coating includes a semiconducting material.

6. The material as defined in claim 1, wherein said coating includes ferrite, silicon metal, germanium metal, glassy carbon, boron, arsenide, selenide, or other high resistivity metallic or semiconducting material.

7. The material as defined in claim 1, wherein said coating includes an inorganic material.

8. The material as defined in claim 1, wherein said coating includes one or more materials selected from the group consisting of silica, silicate, silicate glass, BN, BN nanosheets, AlN, Si$_3$N$_4$, TiO$_2$, titanate, Al$_2$O$_3$, SiOC, SiAlON, aluminate, aluminosilicate, mica, B$_2$O$_3$, borosilicate, borate glass, Fe$_3$O$_4$, (Mn(Fe$_2$O$_4$), and Zn(Fe$_2$O$_4$).

9. The material as defined in claim 1, wherein said coated particle has at least one dimension in the 0.5-20 μm size range, and a second dimension 10-5000× greater than said first dimension.

10. The material as defined in claim 1, said particles includes a second coating, said second coating is in the form of a nanosheet.

11. The material as defined in claim 1, wherein said material is used as part of power system that is selected from the group consisting of a power converter, power supply, pulse forming network, inverter, rectifier, motor controller system, part of a transformer, choke, inductor, and filter circuit.

12. The material as defined in claim 11, wherein said power system operates at a frequency above 50 KHz.

13. The material as defined in claim 11, wherein said power system operates at a frequency above 200 KHz.

14. The material as defined in claim 11, wherein said power system operates at a frequency above 500 KHz.

15. The material as defined in claim 1, wherein said material is used as a power system which includes a wide band gap semiconductor that is selected from the group consisting of a silicon-carbon and a gallium-nitrogen power electronic component.

16. A low loss, high magnetic saturation magnetic material having a saturation magnetization above 1.5 T and a power density of less than 2000 kW/m$^3$ at frequencies above 5 KHz; said material formed from a plurality of magnetic particles having an average particle size of 20-1500 μm and having a saturation magnetization above 1.5 T; said magnetic particles including a thermally-stable coating prior to formation of said low loss, high magnetic saturation magnetic material; said thermally-stable coating having a melting point above 350° C.; said thermally-stable coating having a thickness of 5-200 nm prior to formation of said low loss, high magnetic saturation magnetic material; said magnetic particles include one or more materials selected from the group consisting of iron, iron-silicon, glassy iron, iron-nickel, iron-cobalt-vanadium, NiTi, orthinol, silicon steel, and iron-cobalt alloy; said coating including one of more of A) polymer that includes one or more materials selected from the group consisting of polyether ether ketone, polyimide, polyphenyl sulfone, polysiloxane, silicone, polysilizane, phenolic, B) inorganic material that includes one or more materials selected from the group consisting of silica, silicate, silicate glass, BN, BN nanosheets, Si$_3$N$_4$, TiO$_2$, titanate, MgO, Al$_2$O$_3$, SiOC, SiAlON, aluminate, aluminosilicate, mica, B$_2$O$_3$, borosilicate, borate glass, Fe$_3$O$_4$, Mn(Fe$_2$O$_4$), and Zn(Fe$_2$O$_4$), and C) metal material including one or more materials selected from the group consisting of iron, ferrite, silicon metal, germanium metal, carbon, boron, arsenide, and selenide; said low loss, high magnetic saturation magnetic material formed by a consolidation process by a sintering process that includes use of heat and pressure to cause said coating on different coated magnetic particles to flow and bond together; said low loss, high magnetic saturation magnetic material formed by said sintering process has a density that is greater than 90% of a theoretical density of said magnetic particles.

17. The low loss, high magnetic saturation magnetic material as defined in claim 16, wherein said coating includes said metal material, said metal material including one or more materials selected from the group consisting of iron, ferrite, silicon metal, germanium metal, carbon, boron, arsenide, and selenide.

18. The low loss, high magnetic saturation magnetic material as defined in claim 16, wherein said coating includes said inorganic material, said inorganic material that includes one or more materials selected from the group consisting of silica, BN, BN nanosheets, AlN, Si$_3$N$_4$, TiO$_2$, titanate, MgO, Al$_2$O$_3$, SiOC, SiAlON, aluminate, aluminosilicate, mica, B$_2$O$_3$, borosilicate, borate glass, Fe$_3$O$_4$, Mn(Fe$_2$O$_4$), and Zn(Fe$_2$O$_4$).

19. The low loss, high magnetic saturation magnetic material as defined in claim 16, wherein a BN nanosheet is applied to said coated magnetic particles.

* * * * *